United States Patent
Lin et al.

(10) Patent No.: US 8,300,469 B2
(45) Date of Patent: Oct. 30, 2012

(54) COST SAVING ELECTRICALLY-ERASABLE-PROGRAMMABLE READ-ONLY MEMORY (EEPROM) ARRAY

(75) Inventors: Hsin Chang Lin, Hsinchu County (TW); Chia-Hao Tai, Hsinchu County (TW); Yang-Sen Yen, Hsinchu County (TW); Ming-Tsang Yang, Hsinchu County (TW); Ya-Ting Fan, Hsinchu County (TW)

(73) Assignee: Yield Microelectronics Corp., Hsinchu County (TW)

( * ) Notice: Subject to any disclaimer, the term of this patent is extended or adjusted under 35 U.S.C. 154(b) by 171 days.

(21) Appl. No.: 12/854,407

(22) Filed: Aug. 11, 2010

(65) Prior Publication Data

US 2012/0039129 A1    Feb. 16, 2012

(51) Int. Cl.
*G11C 16/04* (2006.01)
(52) U.S. Cl. .......... 365/185.18; 365/185.13; 365/185.29
(58) Field of Classification Search ............. 365/185.18, 365/185.13, 185.29
See application file for complete search history.

(56) References Cited

U.S. PATENT DOCUMENTS

| | | | | |
|---|---|---|---|---|
| 5,450,360 A | * | 9/1995 | Sato | 365/200 |
| 6,256,228 B1 | * | 7/2001 | Hirano | 365/185.11 |
| 6,480,418 B2 | * | 11/2002 | Tanaka et al. | 365/185.13 |
| 6,519,184 B2 | * | 2/2003 | Tanaka et al. | 365/185.22 |
| 6,545,915 B2 | * | 4/2003 | Ohtani et al. | 365/185.29 |
| 6,731,544 B2 | * | 5/2004 | Han et al. | 365/185.28 |
| 7,924,630 B2 | * | 4/2011 | Carman | 365/189.04 |

* cited by examiner

Primary Examiner — Pho M Luu
(74) Attorney, Agent, or Firm — Rosenberg, Klein & Lee

(57) ABSTRACT

A cost saving EEPROM array, having: a plurality of parallel bit lines, a plurality of parallel word lines, and a plurality of parallel common source lines. The bit lines contain a first group bit lines; the word line includes a first and a second word lines; and the common source line includes a first common source line. And, a plurality of sub-memory arrays are provided. Each sub-memory array includes a first and a second memory cells disposed opposite to each other and located on two different sides of the first common source line; the first memory cell is connected to the first group bit lines, the first common source line, and the first word line, and the second memory cell is connected to the first group bit line, the first common source line, and the second word line.

16 Claims, 9 Drawing Sheets

COST SAVING ELECTRICALLY-ERASABLE-PROGRAMMABLE READ-ONLY MEMORY (EEPROM) ARRAY

BACKGROUND OF THE INVENTION

1. Field of the Invention

The present invention relates to a memory array, and in particular to a cost saving electrically-erasable-programmable read-only memory (EEPROM) array.

2. The Prior Arts

Presently, in the semiconductor industry, Complementary Metal Oxide Semiconductor (CMOS) manufacturing process has become an ordinary manufacturing method for Application Specific Integrated Circuit (ASIC). With the rapid progress and development of the computer and information products, Flash memory and electrically-erasable-programmable read-only memory (EEPROM) have been widely utilized in various electronic products for its non-volatile memory capability of being electrically programmable and erasable, such that data stored thereon will not be lost, even when its power supply is turned off.

In general, a non-volatile memory is programmable, and the memory stores charges in order to change the gate voltage of a transistor in the memory, or the memory will not store charges, such that the gate voltage remains unchanged as the original gate voltage of the transistor in the memory. For an erasure operation, the charges stored in the non-volatile memory are removed, such that the gate voltage of the transistor in the memory will return to its original value. As to the architecture of the Flash Memory at present, though it has the advantages of low cost and occupying small area, yet it can only support writing and erasing of large blocks of memory, and it is not able to perform writing and erasing for a specific bit memory cell, thus it is not quite convenient in application. In addition, for the architecture of an electrically-erasable-programmable read-only memory (EEPROM), it is capable of byte-writing memory on a byte basis, therefore, it is much more convenient in application as compared with the Flash Memory. Refer to FIGS. 1 & 2 for a circuit diagram of a bit memory cell, and a cross section view of bit memory cell of the prior art respectively. As shown in FIGS. 1 and 2, each memory cell contains: two transistors, wherein, one of them is a memory transistor 10, and the other is a switching transistor 12; and a capacitor 13, disposed on top of the memory transistor 10, hereby forming a poly-silicon memory cell. The problem of this kind of memory structure is that, the area required is larger than that of the flash memory; also, in performing bit erasing of memory, the memory cells not being selected must be isolated with transistors, thus raising the production cost.

Therefore, presently, the performance and cost effectiveness of the EEPROM are not quite satisfactory, and it has much room for improvement.

SUMMARY OF THE INVENTION

In view of the problems and shortcomings of the prior art, the present invention provides a cost saving electrically-erasable-programmable read-only memory (EEPROM) array, that is capable of solving the problems of the prior art.

A major objective of the present invention is to provide a cost saving electrically-erasable-programmable read-only memory (EEPROM) array having the advantage of small area and cost saving, such that it is capable of memory writing and erasing on a byte basis by means of the voltage applied.

In order to achieve the above mentioned objective the present invention provides a cost saving electrically-erasable-programmable read-only memory (EEPROM) array, comprising: a plurality of parallel bit lines, that are classified into a plurality groups of bit lines, containing a first group bit lines; a plurality of parallel word lines, arranged perpendicular to the bit lines, and containing a first word line and a second word line; a plurality of parallel common source lines, arranged parallel to the word lines, and containing a first common source line; and a plurality of sub-memory arrays, each connected to a group of bit lines, two word lines, and a common source line. Each sub-memory array includes a first memory cell and a second memory cell. Wherein, the first memory cell is connected to a first group bit lines, a first common source line, and a first word line; and the second memory cell is connected to a first group bit lines, a first common source line, and a second word line. The first memory cell and the second memory cell are arranged opposite to each other, and are located on two different sides of the first common source line.

The first and second memory cells can both be operation memory cells. In selecting one of the operation memory cells as a selected memory cell in carrying out its operations, the operation memory cells, that are connected to the same bit line connecting to the selected memory cell, but not connected to the same common source line connecting to the selected memory cell, are referred to as a plurality of common bit line memory cells; the operation memory cell, that is connected to the same bit line and the same common source line connecting to the selected memory cell, is referred to as a common source memory cell; and the operation memory cells, that are connected to the same word line connecting to the selected memory cell, are referred to as a plurality of common word memory cells; and the rest of the operation memory cells are referred to a plurality of unselected memory cells.

The first and second memory cells may both contain an N-type field effect transistor located in a P-type well region or in a P-type substrate. Or, alternatively, they may both contain a P-type field effect transistor located in an N-type well region or in an N-type substrate.

In case that the memory utilized contains an N-type field effect transistor, when in operations, performing the following voltage applications as required: applying a substrate voltage $V_{subp}$ on a P-type well region or a P-type substrate connecting to a selected memory cell; applying a first bit voltage $V_{b1}$, a first word voltage $V_{w1}$, a first common source voltage $V_{s1}$ on a bit line, a word line, and a common source line, all three connecting to each selected memory cell; applying second word voltage $V_{w2}$, a second common source voltage $V_{s2}$ respectively on a word line and a common source line connecting to each common bit memory cell; applying a second bit voltage $V_{b2}$, a first common source voltage $V_{s1}$ on a bit line and common source line connecting to each common word memory cell (each of the common word memory cells sharing a common source line); applying a second word voltage $V_{w2}$ on the word line connecting to each common source memory cell; and applying a second bit voltage $V_{b2}$, a second word voltage $V_{w2}$, and a second common source voltage $V_{s2}$ on the bit line, the word line, and the common source line connecting to each un-selected memory cell. As such, in writing data into a memory, the following conditions must be satisfied: $V_{subp}$ is ground voltage, $V_{b2}$ is floating, $V_{b1} > V_{s1}$, $V_{w1} > V_{s1}$, $V_{b1} > V_{s1} > 0$, $V_{b1} > V_{w2} > 0$, $V_{b1} > V_{s2} > 0$; and in erasing data from the memory, the following conditions must be satisfied: $V_{subp}$ is wound voltage, $V_{s1}$ is ground voltage, $V_{b2}$ is floating, $V_{b1} > V_{w2} > V_{w1} \geqq 0$, and $V_{b1} > V_{s2} > V_{w1} \geqq 0$.

In case that the memory utilized contains a P-type field effect transistor, when in operations, performing the following voltage applications as required: applying a substrate voltage $V_{subn}$ on an N-type well region or an N-type substrate connecting to a selected memory cell. As such, in case that the memory utilized contains a P-type field effect transistor, such that in writing data into a memory, the following conditions must be satisfied: $V_{b2}$ is floating, $V_{subn} > V_{s1} > V_{b1}$, $V_{subn} > V_{s1} > V_{w1}$, $V_{subn} > V_{s2} > V_{b1}$, $V_{subn} > V_{w2} > V_{b1}$; and in erasing data from the memory, the following conditions must be satisfied: $V_{b2}$ is floating, $V_{subn} = V_{s1} \geq V_{w1} > V_{b1}$, $V_{subn} > V_{s2} > V_{b1}$, and $V_{subn} > V_{w2} > V_{b1}$.

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from this detailed descriptions.

BRIEF DESCRIPTION OF THE DRAWINGS

The related drawings in connection with the detailed descriptions of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

Figure 1:
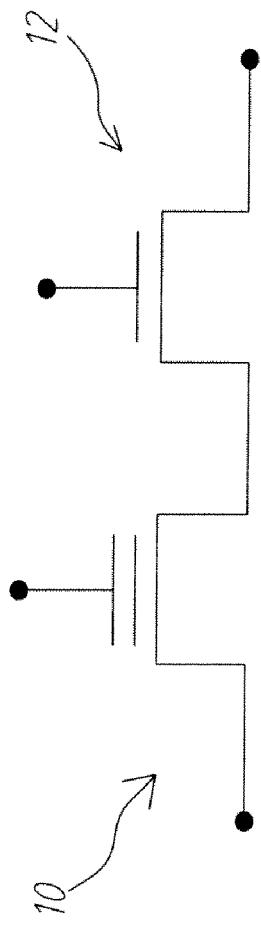
FIG. 1 is a circuit diagram of a bit memory cell according to the prior art.
Figure 2:
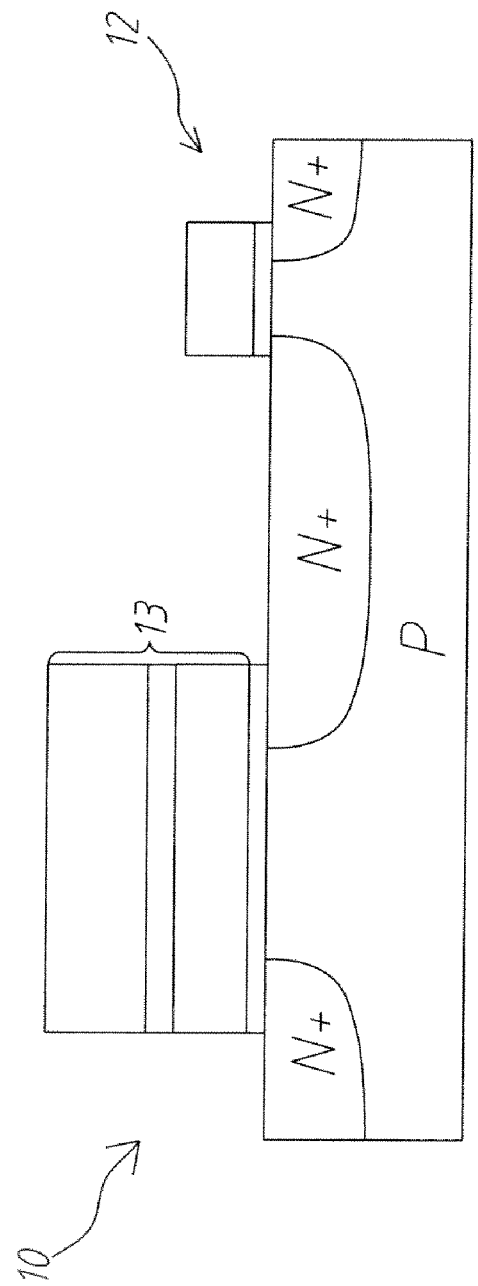
FIG. 2 is a cross section view of bit memory cell according to the prior art.
Figure 3:
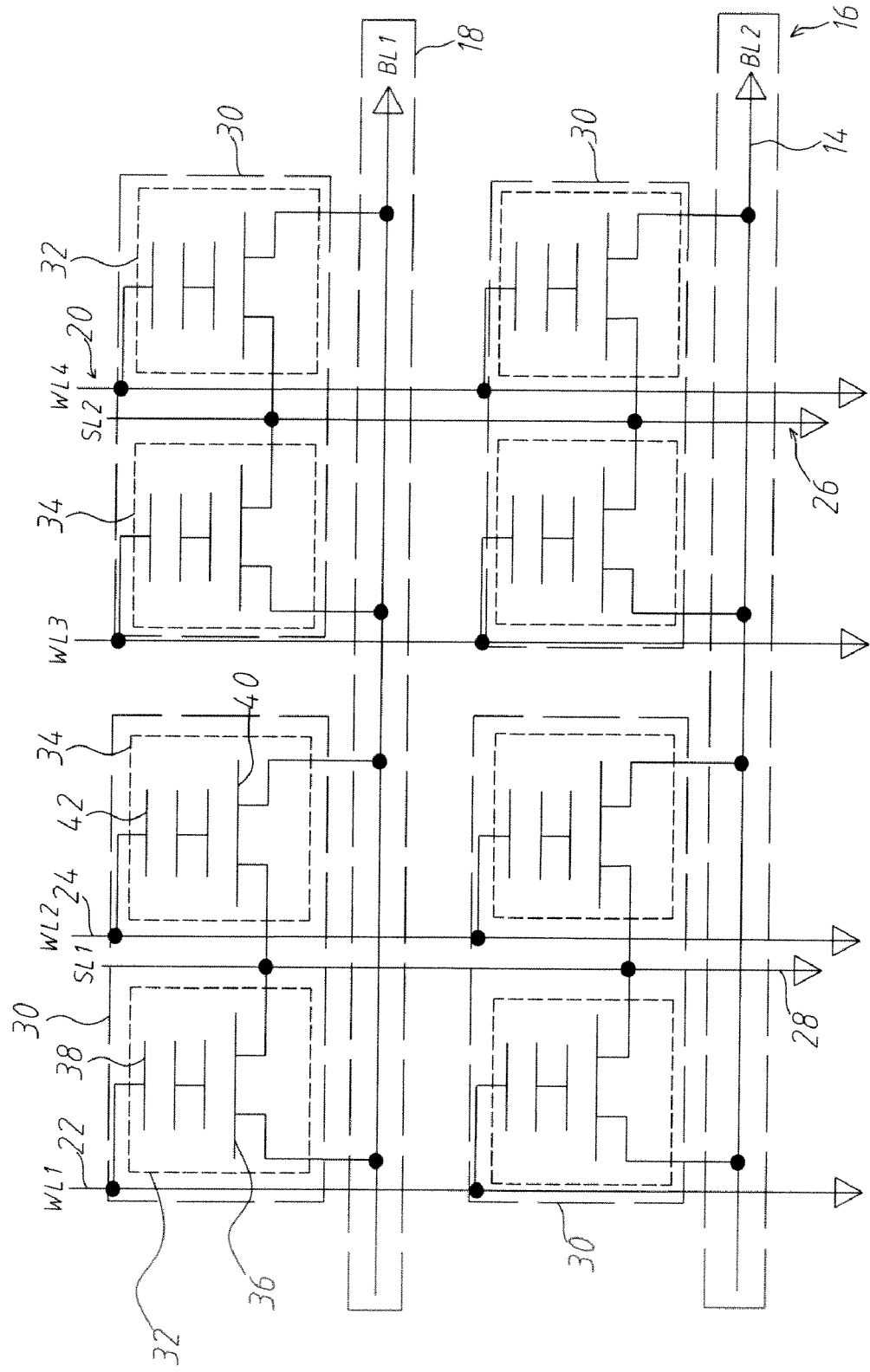
FIG. 3 is a circuit diagram of electrically-erasable programmable read-only memory (EEPROM) array according to a first embodiment of the present invention.
Figure 4:
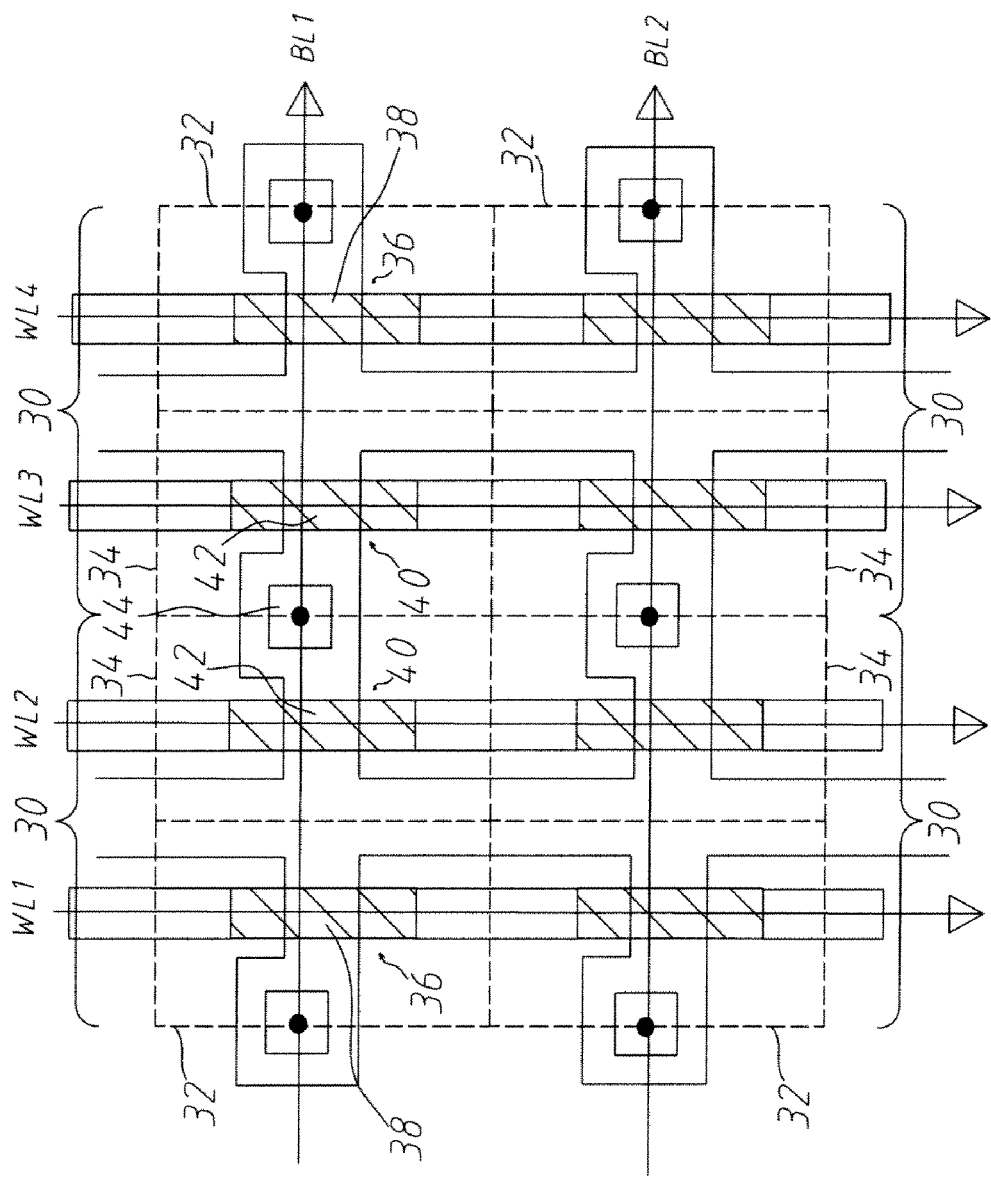
FIG. 4 is a circuit diagram of a layout of electrically-erasable programmable read-only memory (EEPROM) array according to a first embodiment of the present invention.

Firstly, refer to FIGS. 3 and 4 respectively for a circuit diagram of electrically-erasable programmable read-only memory (EEPROM) array according to a first embodiment of the present invention, and a circuit diagram of a layout of electrically-erasable programmable read-only memory (EE-PROM) array according to a first embodiment of the present invention. As shown in FIGS. 3 and 4, the EEPROM of the present invention comprising: a plurality of parallel bit lines 14, that are classified into a plurality groups of bit lines 16, containing a first group bit lines 18, which includes a bit line 14; a plurality of parallel word lines 20, arranged perpendicular to the bit lines 14, and containing a first word line 22 and a second word line 24; a plurality of parallel common source lines 26, containing a first common source line 28, and are arranged parallel to the word lines 20; and a plurality of sub-memory arrays 30, namely a 2×1 bit memory cell, connected to the bit lines 14, word line 20, and common source line 26. As such, each sub-memory array 30 is connected to a group of bit lines 16, two word lines 20, and a common source line 26. Since the connections of bit lines 16, two word lines 20, and a common source line 26 to each sub-memory arrays 30 are similar, they will be described in detail as follows.

Figure 5:
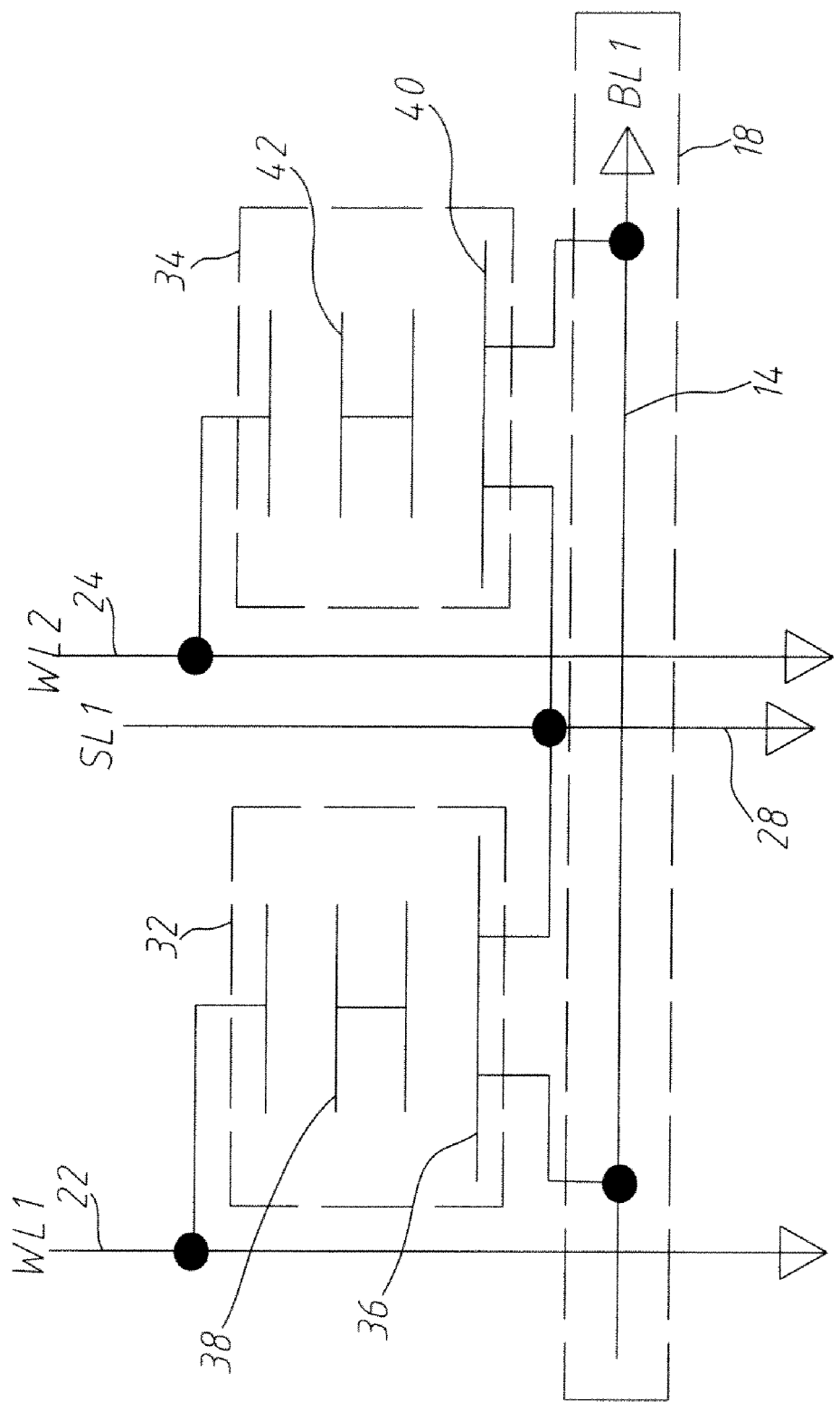
FIG. 5 is a circuit diagram of a sub-memory array according to a first embodiment of the present invention.

Refer to FIGS. 4 and 5. FIG. 5 is a circuit diagram of a sub-memory array according to a first embodiment of the present invention. As shown in FIG. 4 and FIG. 5, each sub-memory array 30 includes a first memory cell 33 and a second memory cell 34. Wherein, the first memory cell 32 is connected to bit lines 14 of a first group bit lines 18, a first common source line 28, and a first word line 22; and the second memory cell 34 is connected to bit lines 14 of a first group bit lines 18, a first common source line 28, and a second word line 24. The first memory cell 32 and the second memory cell 34 are arranged opposite to each other, and are located on two different sides of the first common source line 28. Moreover, in two adjacent sub-memory arrays 30, two second memory cells 34 are disposed adjacent to each other and are connected to a same bit line 14, no as to share the same connection point, hereby reducing area of the overall layout.

The first memory cell 32 includes a field effect transistor 36 and a capacitor 38, the field effect transistor 36 has a floating gate, and with its drain connected to a bit line 14 of a first group bit lines 18, and with its source connected to a first common source line 24. One end of the capacitor 38 is connected to the floating gate of the field effect transistor 36, and with its other end connected to a first word line 22, so as to receive voltage of the first word line 22. The field effect transistor 36 receives the voltages of the first common source line 24, and the voltage of the bit line 14 of the first group bit lines 18, such that field effect transistor 36 can write data into its floating gate, or erase data from its floating gate.

The second memory cell 34 includes a field effect transistor 40 and a capacitor 42, the field effect transistor 40 has a floating gate, and with its drain connected to a bit line 14 of a first group bit lines 18, and with its source connected to a first common source line 28. One end of the capacitor 42 is connected to the floating gate of the field effect transistor 40, and with its other end connected to a second word line 24, so as to receive voltage of the second word line 24. The field effect transistor 40 receives the voltage of the first common source line 28, and the voltage of the bit line 14 of the first group bit lines 18, such that field effect transistor 40 can write data into its floating gate, or erase data from its floating gate. In addition, in two adjacent sub-memory arrays 30, field effect transistors 40 of two second memory cells 34 are disposed adjacent to each other and are connected to a same bit line 14, so s to share the same drain connection point 44, hereby reducing area of the overall layout.

Then, refer to FIG. 3 for a circuit diagram of electrically-erasable programmable read-only memory (EEPROM) array according to a first embodiment of the present invention. As shown in FIG. 3, the field effect transistors 36 and 40 can both be an N-type field effect transistor located in a P-type well region or in a P-type substrate. Or, alternatively, they can both be a P-type field effect transistor located in an N-type well region or in an N-type substrate. In the present invention, the operations for N-type field effect transistor or P-type field effect transistor are different. Therefore, in the following, the operations for field effect transistors 36 and 40 of an N-type field effect transistors are first described. In order to understand the ways of operations, the names of various memory cells are first clearly defined as follows.

In the description mentioned above, the first and second memory cells 32 and 34 can both be considered as operation memory cells, and one of the operation memory cells can be chosen as the selected memory cell to proceed with the operations as required. As to the operation memory cells, that are connected to the same bit line 14 connecting to the selected memory cell, but not connected to the same common source line 26 connecting to the selected memory cell, are referred to as a plurality of common bit memory cells; the operation memory cells, that are connected to the same bit line 14 and the same common source line 26 and both connecting to the selected memory cell, are referred to as a plurality of common source memory cells; and the operation memory cells, that are connected to the same word line 20 connecting to the selected memory cell, are referred to as a plurality of common word memory cells; and the rest of the operation memory cells are referred to as a plurality of unselected memory cells.

In the following, the operations of the first embodiment are described, such that in this way of operation, other un-selected memory cells not connected to the same common source line connecting to the selected memory cell will not be affected.

When operating on said selected memory cells, performing the following voltage applications as required: applying a substrate voltage $V_{subp}$ on a P-type well region or a P-type substrate connecting to a selected memory cell; applying a first bit voltage $V_{b1}$, a first word voltage $V_{w1}$, a first common source voltage $V_{s1}$ on a bit line 14, a word line 20, and a common source line 26, both connecting to the selected memory cell; applying second word voltage $V_{w2}$, a second common source voltage $V_{s2}$ respectively on the word line 20 and the common source line 26, both connecting to each common bit memory cell; applying a second bit voltage $V_{b2}$, a first common source voltage $V_{s1}$ on a bit line 14 and a common source line 26 connecting to each common word memory cell (each of the common word memory cells sharing a common source line); applying a second word voltage $V_{w2}$ on the word line 20 connecting to the common source memory cell; and applying a second bit voltage $V_{b2}$, a second word voltage $V_{w2}$, and a second common source voltage $V_{s2}$ on the bit line 14, the word line 20, and the common source line 26, all three connecting to each un-selected memory cell. then in writing data into a memory, the following conditions must be satisfied: $V_{subp}$ is a ground voltage, $V_{b2}$ is floating, $V_{b1} > V_{s1}$, $V_{w1} > V_{s1}$, $V_{b1} > V_{s1} > 0$, $V_{b1} > V_{w2} > 0$, $V_{b1} > V_{s2} > 0$; and in erasing data from the memory, the following conditions must be satisfied: $V_{subp}$ is a ground voltage, $V_{s1}$ is a ground voltage, $V_{b2}$ is floating, $V_{b1} > V_{w2} > V_{w1} \geq 0$, and $Vb_1 > Vs_2 > V_{w1} \geq 0$.

In case that the memory cell utilized contains a P-type field effect transistor, when in operations, performing the following voltage applications as required: applying a substrate voltage $V_{subn}$ on an N-type well region or an N-type substrate connecting to a selected memory cell. As such, In case that the memory utilized contains a P-type field effect transistor, such that in writing data into a memory, the following conditions must be satisfied: $V_{b2}$ is floating, $V_{subn} > V_{s1} > V_{b1}$, $V_{subn} > V_{s1} > V_{w1}$, $V_{subn} > V_{s2} > V_{b1}$, $V_{subn} > V_{w2} > V_{b1}$; and in erasing data from the memory, the following conditions must be satisfied: $V_{subn} = V_{s1} \geq V_{w1} > V_{b1}$, $V_{subn} > V_{s2} > V_{b1}$, and $V_{subn} > V_{w2} > V_{b1}$.

When performing erasure operation for the selected memory cells, it has to be noted that, the operation memory cell that is connected to the same bit line 14 and the same common source line 26 and both connecting to the selected memory cell is sure to be affected by the voltage of the common source line 26, and thus being written data, Therefore, after a bit memory cell has been written data, a special voltage is used to restore the memory cell being miswritten data. In other words, in the way of applying voltages mentioned above, the byte-writing and byte-erasing of the non-volatile memory cell can be realized without having to add any additional components to insolate the transistors.

Figure 6:
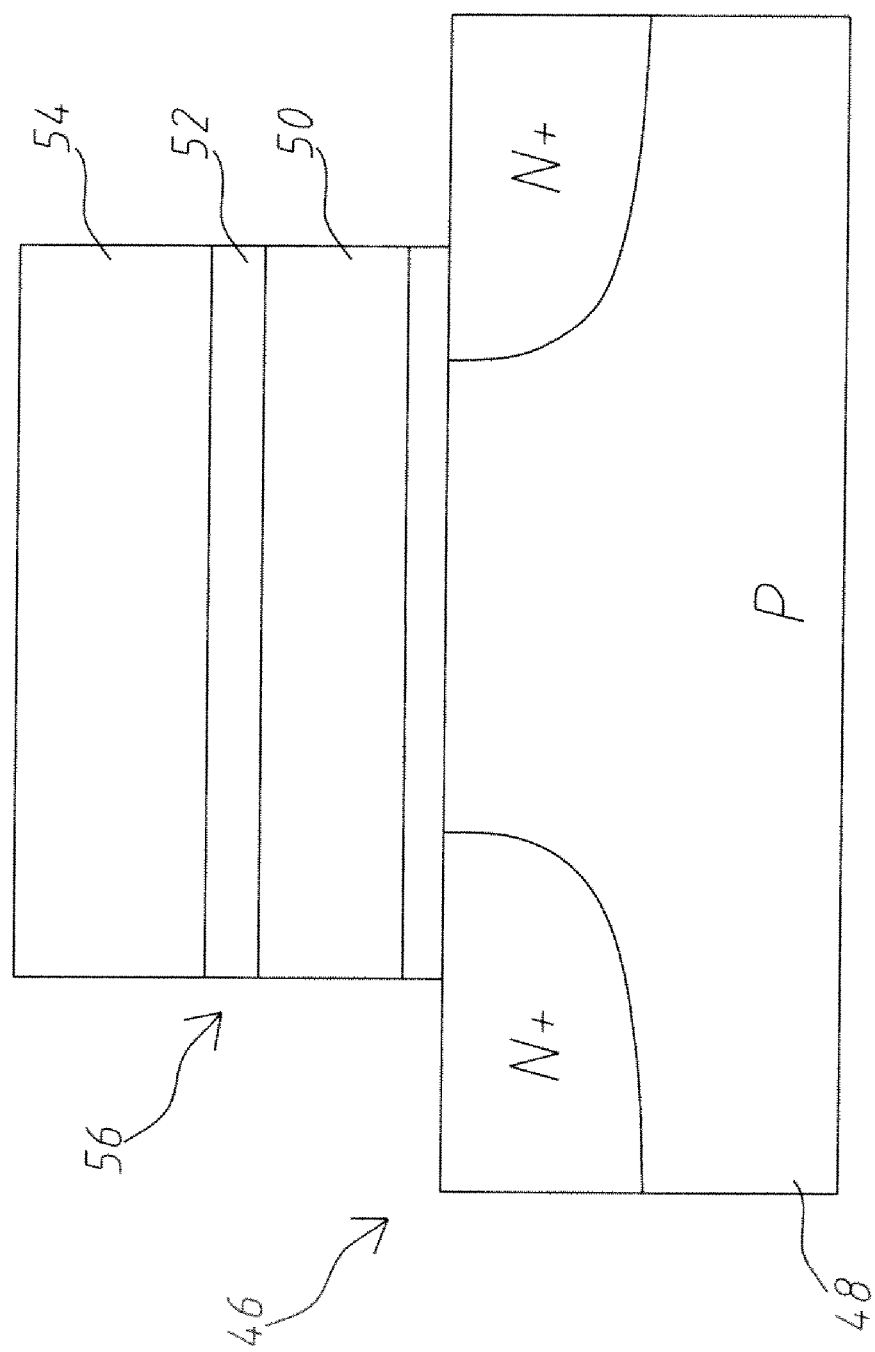
FIG. 6 is a cross section view of a structure of an N-type field effect transistor and a capacitor according to an embodiment of the present invention.

In the following, a cross section view of a structure of field effect transistors 36 and 40 and capacitors 38 and 42 of the present invention is described. In this case, an N-type field effect transistor is taken as an example for explanation. As shown in FIG. 6, an N-type field effect transistor 46 is disposed in a P-type semiconductor substrate 48, and is provided with a floating gate 50. On the floating gate 50 is provided sequentially with an oxide layer 52 and a control gate 54, such that the control gate 54, the oxide layer 52, and the floating gate 50 form a capacitor 56, and the floating gate 50 and the control gate 54 are made of poly-silicon. In case that a P-type semiconductor substrate is utilized, then a P-type well region can be provided in the substrate, such that an N-type field effect transistor 46 is disposed in the P-type well region. In such a structure design of memory cell, namely, the structure of Flash memory, the area and cost required for the non-volatile memory array can be reduced significantly.

Figure 7:
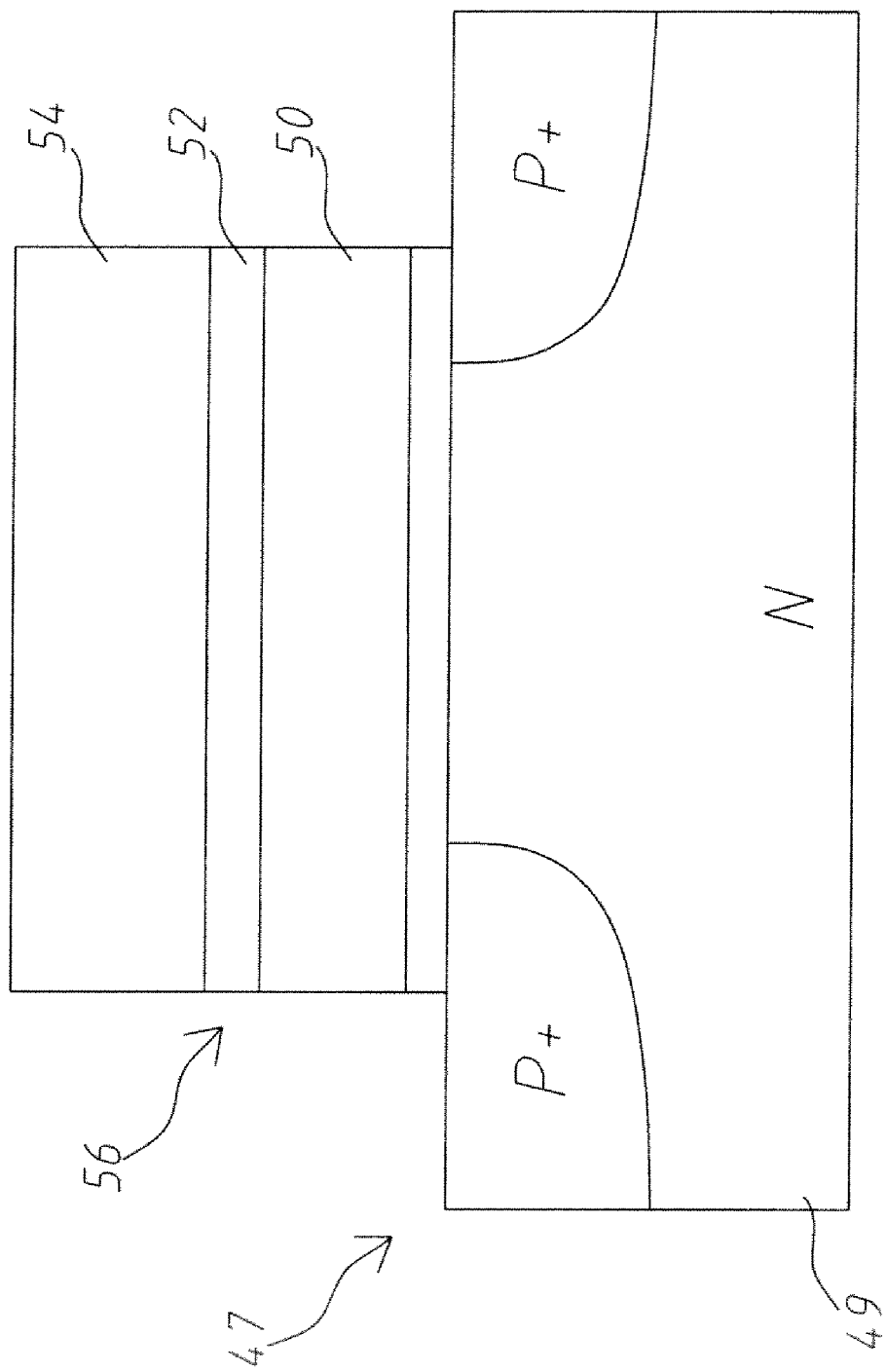
FIG. 7 is a cross section view of a structure of a P-type field effect transistor and a capacitor according to an embodiment of the present invention.

Similarly, in the following, a cross section view of a structure of field effect transistors 36 and 40 and capacitors 38 and 42 of the present invention is described. In this case, a P-type field effect transistor is taken as an example for explanation. As shown in FIG. 7, a P-type field effect transistor 47 is disposed in an N-type semiconductor substrate 49, and is provided with a floating gate 50. On the floating gate 50 is provided sequentially with an oxide layer 52 and a control gate 54, such that the control gate 54, the oxide layer 52, and the floating gate 50 form a capacitor 56, and the floating gate 50 and the control gate 54 are made of poly-silicon. In case that an N-type semiconductor substrate is utilized, then an N-type well region can be provided in the substrate, such that a P-type field effect transistor 47 is disposed in an N-type well region. In such a structure design of memory cell, namely, the structure of Flash memory, the area and cost required for the non-volatile memory can be reduced significantly.

Figure 8:
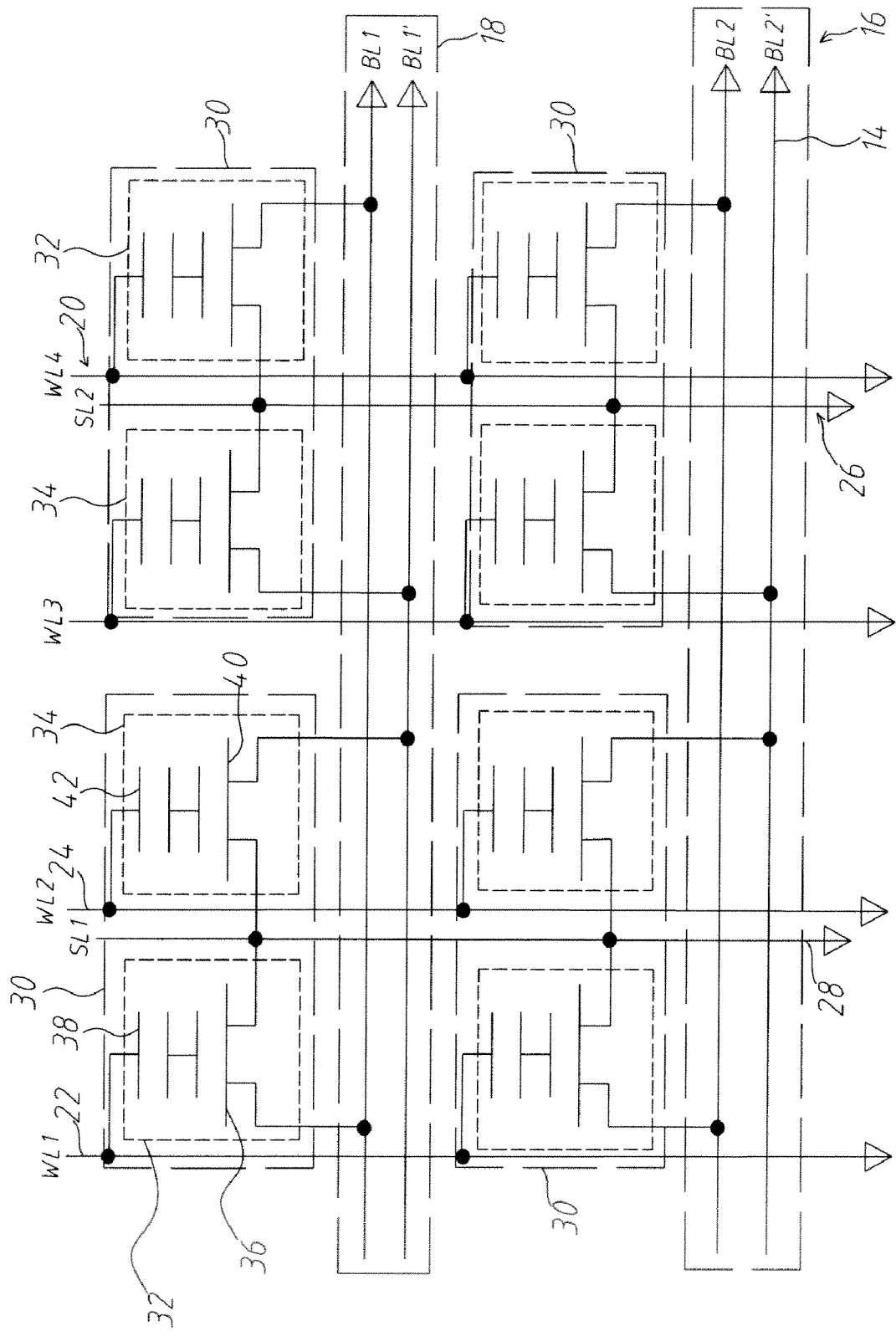
FIG. 8 is a circuit diagram of electrically-erasable programmable read-only memory (EEPROM) array according to a second embodiment of the present invention.
Figure 9:
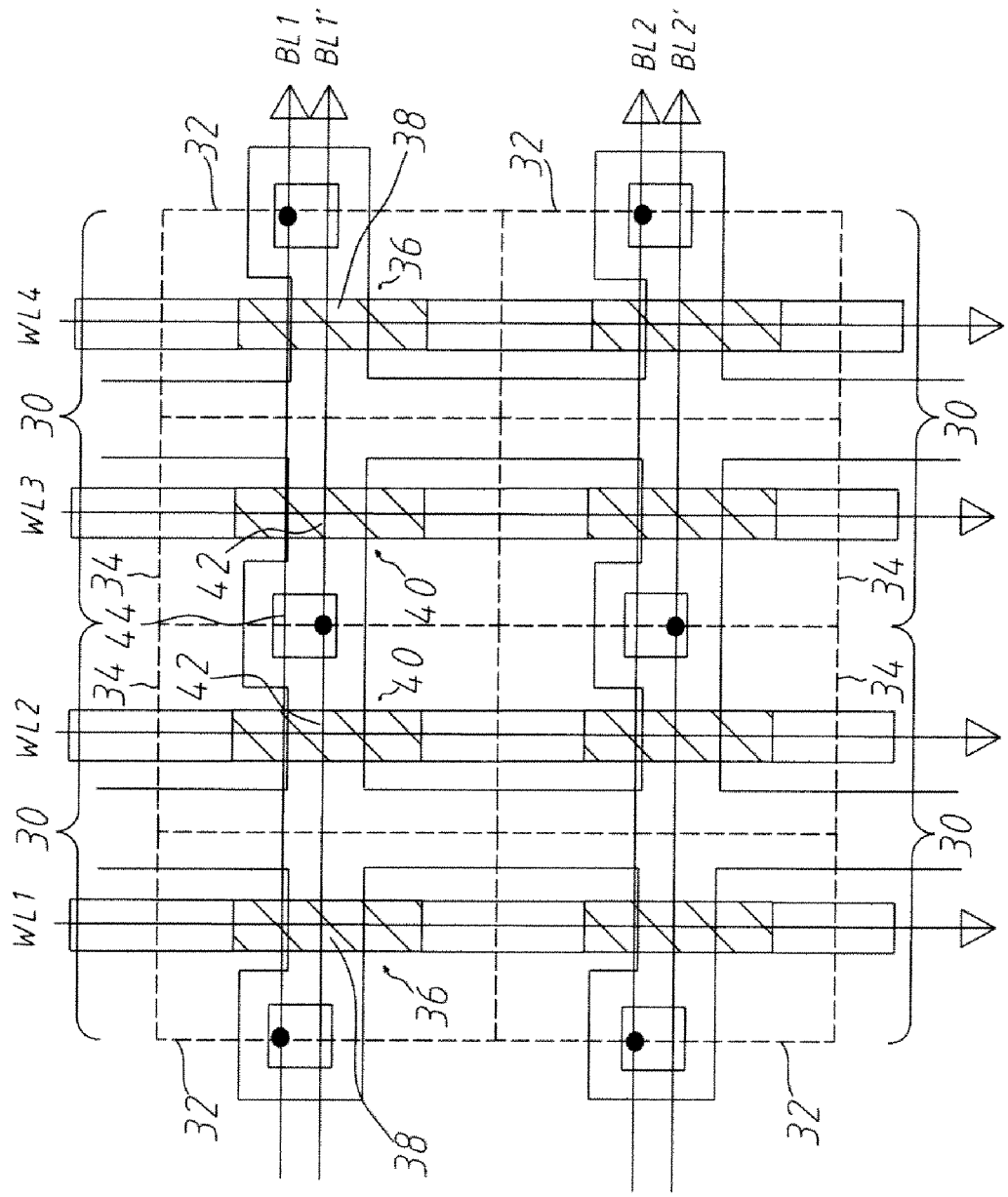
FIG. 9 is a circuit diagram of a layout of electrically-erasable programmable read-only memory (EEPROM) array according to a second embodiment of the present invention.
Figure 10:
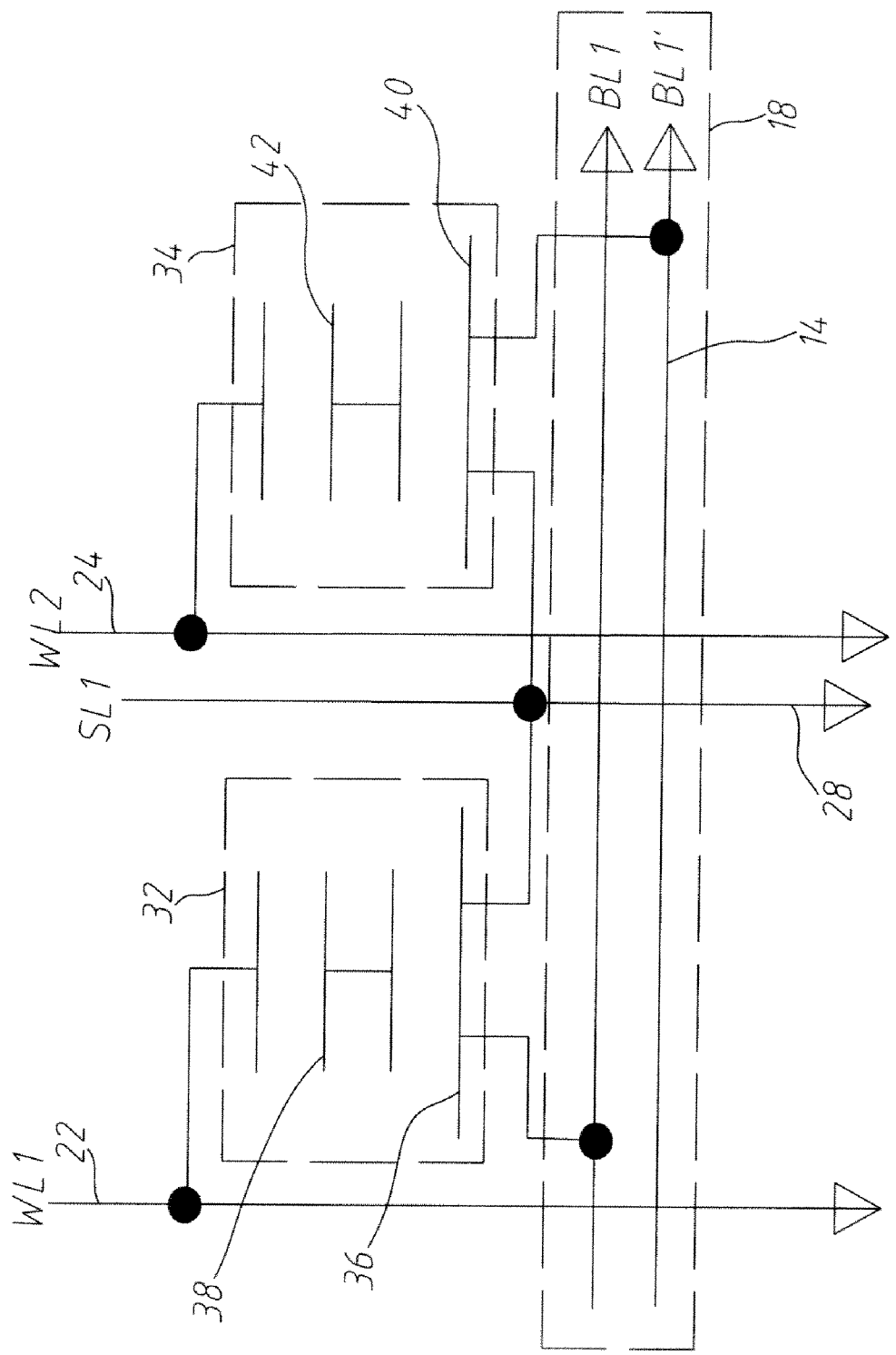
FIG. 10 is a circuit diagram of a sub-memory array according to a second embodiment of the present invention.

In order to avoid completely the data miswriting operations mentioned above, a second embodiment is provided. Refer respectively to FIG. 8 for a circuit diagram of electrically-erasable programmable read-only memory (EEPROM) array according to a second embodiment of the present invention; FIG. 9 for a circuit diagram of a layout of electrically-erasable programmable read-only memory (EEPROM) array according to a second embodiment of the present invention; and FIG. 10 for a circuit diagram of a sub-memory array according to a second embodiment of the present invention. As shown in FIGS. 8, 9, and 10, the difference between the second embodiment and the first embodiment is that, in the former embodiment, each group of bit lines 16 include two bit lines 14, therefore, the first group bit lines 18 include two bit lines 14 also, and are connected to the first and second memory cells 32 and 34 of the same sub-memory array 30. In addition, in two adjacent sub-memory arrays 30, two second memory cells 34 are disposed adjacent to each other and are both connected to a same bit line 14, so as to share the same connection point. In other words, the field effect transistors 40 of two second memory cells 34 are disposed adjacent to each other and are both connected to a same bit line 14, so as to share the same drain connection point 44, hereby reducing area of the overall layout.

Then, refer again to FIG. 8. As shown in FIG. 8, the field effect transistors 36 and 40 can both be an N-type field effect transistors located in a P-type well region or in a P-type substrate. Or, alternatively, they can both be a P-type field effect transistor located in an N-type well region or in an N-type substrate. In the second embodiment, the operations for N-type field effect transistor or P-type field effect transistor are different. Therefore, in the following, the operations for field effect transistors 36 and 40 of N-type field effect transistor are first described. In order to understand the ways of operations, the names of various memory cells are first clearly defined as follows.

In the description mentioned above, the first and second memory cells 32 and 34 can both be considered as operation memory cells, and one of the operation memory cells can be chosen as the selected memory cell to proceed with the operations as required. For the operation memory cells, that are connected to the same bit line 14 connecting to the selected memory cell, but not connected to the same common source line 26 connecting to the selected memory cell, are referred to as a plurality of common bit memory cells; and the operation memory cells, that are connected to the same word line 20 connecting to the selected memory cell, are referred to as a plurality of common word memory cells; and the rest of the operation memory cells are referred to a plurality of unselected memory cells.

In the following, the operations of the second embodiment are described, such that in this way of operation, other unselected memory cells will not be affected, thus operation is related to a specific single memory cell.

When operating on said selected memory cells, performing the following voltage applications as required: applying a substrate voltage $V_{subp}$ on a P-type well region or P-type substrate connecting to a selected memory cell; applying a first bit voltage $V_{b1}$, a first word voltage $V_{w1}$, a first common source voltage $V_{s1}$ on a bit line 14, a word line 20, and a common source line 26, all connecting to a selected memory cell; applying second word voltage $V_{w2}$, a second common source voltage $V_{s2}$ respectively on a word line 20 and a common source line 26, both connecting to each common bit memory cell; applying a second bit voltage $V_{b2}$, a first common source voltage $V_{s1}$ on a bit line 14, and a common source line 26, both connecting to each common word memory cell (each of the common word memory cells sharing a common source line); and applying a second bit voltage $V_{b2}$, a second word voltage $V_{w2}$, and a second common source voltage $V_{s2}$ on the bit line 14, the word line 20, and the common source line 26, all connecting to an un-selected memory cell. In writing data into a memory, the following conditions must be satisfied: $V_{subp}$ is a ground voltage, $V_{b2}$ is floating, $V_{b1}>V_{s1}$, $V_{w1},>V_{s1}, V_{b1}>V_{s1}>0, V_{b1}>V_{w2}>0, V_{b1}>V_{s2}>0$; and in erasing data from the memory, the following conditions must be satisfied: $V_{subp}$ is a ground voltage, $V_{s1}$ is a ground voltage, $V_{b2}$ is floating, $V_{b1}>V_{w2}>V_{w1}\geq 0$, and $V_{b1}>V_{s2}>V_{w1}\geq 0$.

In case that the transistor utilized is a P-type field effect transistor, thus when in operations, performing the following voltage applications as required: applying a substrate voltage $V_{subn}$ on an N-type well region or on an N-type substrate connecting to a selected memory cell. As such, in case that the memory cell utilized contains a P-type field effect transistor, such that in writing data into a memory, the following conditions must be satisfied: $V_{b2}$ is floating, $V_{subn}>V_{s1}>V_{b1}$, $V_{subn}>V_{s1}>V_{w1}$, $V_{subn}>V_{s2}>V_{b1}$, $V_{subn}>V_{w2}>V_{b1}$; and in erasing data from the memory, the following conditions must be satisfied: $V_{b2}$ is floating, $V_{subn}=V_{s2}\geq V_{w1}>V_{b1}$, $V_{subn}>V_{s2}>V_{b1}$, and $V_{subn}>V_{w2}>V_{b1}$.

In this way of voltage application mentioned above, the byte-writing and byte-erasing of the non-volatile memory data can be realized without having to add any additional components to insulate the transistors.

Since two memory cells 32 and 34 in a sub-memory array 30 are connected respectively to two bit lines 14, therefore, the first word line 22 and the second word line 24 in the same sub-memory array 30 can be connected to the same voltage, without affecting the bite-writing and bite-erasing functions of the EEPROM of the present invention, namely, it may be connected to outside through a same connection line, hereby reducing the area for the decoding region.

In executing a write operation of the memory cell, a stable high voltage is utilized, and that can be derived from a voltage of roughly 2.5V to 3.3V by means of a charge pump. However, the voltage differences between the drain and the source will generate a current between the drain and the source, thus causing variations of the high voltage utilized, and the greater the current, the greater the high voltage variations, therefore, the charge pump required is stronger, hereby the area required for the circuit layout is larger. Usually, in programming a Flash memory structure, the voltage requirements are: applying high voltage at gate capacitor and drain, with source connected to ground, thus the current between drain and source is about 500 µA/bit. In executing programming of the present invention, the voltage requirements are: applying high voltage at gate capacitor and drain, with source being applied a voltage of intermediate level, thus the current between drain and source is about 50 µA/bit. For the voltage requirement of programming of the present invention, the current between the drain and source is smaller, therefore, the area required for charge pump layout is smaller.

The cross section view of the structure of the field effect transistors 36 and 40, and capacitors 38 and 42 of the second embodiment is the same as that of the first embodiment, and it will not be repeated here for brevity.

Summing up the above, the advantage of the present invention is that, it is capable of providing a Flash memory structure of smaller area at lower cost, and moreover, it is capable of achieving the function of byte-writing and byte-erasing of memory data through applying voltages of various levels.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A cost saving electrically-erasable-programmable read-only memory (EEPROM) array, comprising:
   a plurality of parallel bit lines, that are classified into a plurality groups of bit lines, containing a first group bit lines;
   a plurality of parallel word lines, arranged perpendicular to said bit lines, and containing a first word line and a second word line;
   a plurality of parallel common source lines, arranged parallel to said word line, containing a first common source line; and a plurality of sub-memory arrays, each is connected to a group of said bit lines, two said word lines, and a said common source line, each of said sub-memory arrays includes:
  a first memory cell, connected to said first group bit lines, said first common source line, and said first word line, and
  a second memory cell, connected to said first group bit lines, said first common source line, and said second word line, said first memory cell and said second memory cell are arranged opposite to each other, and are located on two different sides of the first common source line;
wherein said first group bit line includes said bit line, connected to said first and second memory cells; and
when said first and said second memory cells both contain an N-type field effect transistor located in a P-type well region or a P-type substrate, said first and second memory cells are both operation memory cells, in selecting one of said operation memory cells as a selected memory cell in carrying out operations, said operation memory cells, that are connected to said same bit line connecting to said selected memory cell, but not connected to said same common source line connecting to said selected memory cell, are referred to as a plurality of common bit memory cells; said operation memory cell, that is connected to said same bit line and said same common source line, both connecting to said selected memory cell, is referred to as a common source memory cell; and said operation memory cells, that are connected to said same word line connecting to said selected memory cell, are referred to as a plurality of common word memory cells; and rest of said operation memory cells are referred to a plurality of unselected memory cells,
when operating on said selected memory cells, performing the following voltage applications as required:
applying a substrate voltage $V_{subp}$ on said P-type well region or said P-type substrate connecting to said selected memory cell; applying a first bit voltage $V_{b1}$, a first word voltage $V_{w1}$, a first common source voltage $V_{s1}$ on said bit line, said word line, and said common source line, all connecting to said selected memory cell; applying a second word voltage $V_{w2}$, a second common source voltage $V_{s2}$ respectively on said word line and said common source line, both connecting to each said common bit memory cell; applying a second bit voltage $V_{b2}$, said first common source voltage $V_{s1}$ on said bit line and said common source line, both connecting to each said common word memory cell; applying said second word voltage $V_{w2}$ on said word line connecting to said common source memory cell; and applying said second bit voltage $V_{b2}$, said second word voltage $V_{w2}$, and said second common source voltage $V_{s2}$ on said bit line, said word line, and said common source line, all connecting to each said unselected memory cell, such that,
when writing data into a memory, following conditions are to be satisfied:
$V_{subp}$ is a ground voltage, $V_{b2}$ is floating, $V_{b1}>V_{s1}$, $V_{w1}>V_{s1}$, $V_{b1}>V_{s1}>0$, $V_{b1}>V_{w2}>0$, and $V_{b1}>V_{s2}>0$; and
when erasing data from the memory, said following conditions are to be satisfied:
$V_{subp}$ is a ground voltage, $V_{s1}$ is a ground voltage, $V_{b2}$ is floating, $V_{b1}>V_{w2}>V_{w1}\geq 0$, and $V_{b1}>V_{s2}>V_{w1}\geq 0$.

2. The cost saving electrically-erasable-programmable read-only memory (EEPROM) array as claimed in claim 1, wherein
said first group bit line includes two said bit lines, connected respectively to said first and second memory cells.

3. The cost saving electrically-erasable-programmable read-only memory (EEPROM) array as claimed in claim 2, wherein
in two adjacent said sub-memory arrays, two said second memory cells are disposed adjacent to each other and are connected to said same bit line, so as to share a same connection point.

4. The cost saving electrically-erasable-programmable read-only memory (EEPROM) array as claimed in claim 2, wherein
when said first and said second memory cells both contain said N-type field effect transistor located in said P-type well region or in said P-type substrate, said first and second memory cells are both said operation memory cell, in selecting one of said operation memory cells as said selected memory cell in carrying out operations, said operation memory cells, that are connected to said same bit line connecting to said selected memory cell, but not connected to said same common source line connecting to said selected memory cell, are referred to as said plurality of common bit memory cells; said operation memory cells, that are connected to said same word line connecting to said selected memory cell, are referred to as said plurality of common word memory cells; and rest of said operation memory cells are referred to said plurality of unselected memory cells,
when operating on said selected memory cells, performing the following voltage applications as required:
applying said substrate voltage $V_{subp}$ on said P-type well region or said P-type substrate connecting to said selected memory cell; applying said first bit voltage $V_{b1}$, said first word voltage $V_{w1}$, said first common source voltage $V_{s1}$ on said bit line, said word line, and said common source line, all three connecting to said selected memory cell; applying said second word voltage $V_{w2}$, said second common source voltage $V_{s2}$ respectively on said word line and said common source line, both connecting to each said common bit memory cell; applying said second bit voltage $V_{b2}$, said first common source voltage $V_{s1}$ on said bit line and said common source line, both connecting to each said common word memory cell; and applying said second bit voltage $V_{b2}$, said second word voltage $V_{w2}$, and said second common source voltage $V_{s2}$ on said bit line, said word line, and said common source line, all three connecting to each said unselected memory cell, such that,
when writing data into a memory, following conditions are to be satisfied:
$V_{subp}$ is a ground voltage, and $V_{b2}$ is floating, $V_{b1}>V_{s1}$, $V_{w1}>V_{s1}$, $V_{b1}>V_{s1}>0$, $V_{b1}>V_{w2}>0$, and $V_{b1}>V_{s2}>0$; and
when erasing data from the memory, said following conditions are to be satisfied:
$V_{subsp}$ is a ground voltage, $V_{s1}$ is a ground voltage, $V_{b2}$ is floating, $V_{b1}>V_{w2}>V_{w1}\geq 0$, and $V_{b1}>V_{s2}>V_{w1}\geq 0$.

5. The cost saving electrically-erasable-programmable read-only memory (EEPROM) array as claimed in claim 2, wherein
when said first and said second memory cells both contain said P-type field effect transistor located in said N-type well region or in said N-type substrate, said first and second memory cells are both said operation memory cells, in selecting one of said operation memory cells as said selected memory cell in carrying out operations, said operation memory cells, that are connected to said same bit line connecting to said selected memory cell, but not connected to said same common source line connecting to said selected memory cell, are referred to as said plurality of common bit memory cells; and said operation memory cells, that are connected to said same word line connecting to said selected memory cell, are referred to as said plurality of common word memory cells; and rest of said operation memory cells are referred to said plurality of unselected memory cells, when operating on said selected memory cells, performing the following voltage applications as required:

applying said substrate voltage $V_{subn}$ on said N-type well region or said N-type substrate connecting to said selected memory cell; applying said first bit voltage $V_{b1}$, said first word voltage $V_{w1}$, said first common source voltage $V_{s1}$ on said bit line, said word line, and said common source line, all three connecting to said selected memory cell; applying said second word voltage $V_{w2}$, said second common source voltage $V_{s2}$ respectively on said word line and said common source line, both connecting to each said common bit memory cell; applying said second bit voltage $V_{b2}$, said first common source voltage $V_{s1}$ on said bit line and said common source line, both connecting to each said common word memory cell; and applying said second bit voltage $V_{b2}$, said second word voltage $V_{w2}$, and said second common source voltage $V_{s2}$ on said bit line, said word line, and said common source line, all three connecting to each said unselected memory cell, such that, when writing data into a memory, following conditions are to be satisfied:

$V_{b2}$ is floating, $V_{subn} > V_{s1} > V_{b1}$, $V_{subn} > V_{s1} > V_{w1}$, $V_{subn} > V_{s2} > V_{b1}$, and $V_{subn} > V_{w2} > V_{b1}$; and when erasing data from the memory, said following conditions are to be satisfied:

$V_{b2}$ is floating, $V_{subn} = V_{s1} \geq V_{w1} > V_{b1}$, $V_{subn} > V_{s2} > V_{b1}$, and $V_{subn} > V_{w2} > V_{b1}$.

6. The cost saving electrically-erasable-programmable read-only memory (EEPROM) array as claimed in claim 2, wherein
said first word line and said second word line in said same sub-memory array are connected to a same word voltage.

7. The cost saving electrically-erasable-programmable read-only memory (EEPROM) array as claimed in claim 1, wherein
in two adjacent said sub-memory arrays, two said second memory cells are disposed adjacent to each other and are connected to said same bit line, so as to share a same connection point.

8. The cost saving electrically-erasable-programmable read-only memory (EEPROM) array as claimed in claim 1, wherein
said first memory cell further comprises:
said field effect transistor, having a floating gate, and with its drain connected to said first group bit lines, and with its source connected to said first common source line; and
a capacitor, with its one end connected to said floating gate, and with its other end connected to said first word line, so as to receive voltage of said first word line, said field effect transistor receives voltage of said first common source line, and voltage of said first group bit lines, such that said field effect transistor writes data into said floating gate, or erases data from said floating gate.

9. The cost saving electrically-erasable-programmable read-only memory (EEPROM) array as claimed in claim 8, wherein
said field effect transistor is said N-type field effect transistor or said P-type field effect transistor.

10. The cost saving electrically-erasable-programmable read-only memory (EEPROM) array as claimed in claim 8, wherein
on said floating gate is provided sequentially with an oxide layer and a control gate, such that said control gate, said oxide layer, and said floating gate form said capacitor, and said floating gate and said control gate are made of poly-silicon.

11. The cost saving electrically-erasable-programmable read-only memory (EEPROM) array as claimed in claim 1, wherein
said second memory cell further comprises:
said field effect transistor, having a floating gate, and with its drain connected to said first group bit lines, and with its source connected to said first common source line; and
a capacitor, with its one end connected to said floating gate, and with its other end connected to said second word line, so as to receive voltage of said second word line, said field effect transistor receives voltage of said first common source line, and voltage of said first group bit lines, such that said field effect transistor writes data into said floating gate, or erases data from said floating gate.

12. The cost saving electrically-erasable-programmable read-only memory (EEPROM) array as claimed in claim 11, wherein
said field effect transistor is said N-type field effect transistor or said P-type field effect transistor.

13. The cost saving electrically-erasable-programmable read-only memory (EEPROM) array as claimed in claim 11, wherein
on said floating gate is provided sequentially with an oxide layer and a control gate, such that said control gate, said oxide layer, and said floating gate form said capacitor, and said floating gate and said control gate are made of poly-silicon.

14. A cost saving electrically-erasable-programmable read-only memory (EEPROM) array, comprising:
a plurality of parallel bit lines, that are classified into a plurality groups of bit lines, containing a first group bit lines;
a plurality of parallel word lines, arranged perpendicular to said bit lines, and containing a first word line and a second word line;
a plurality of parallel common source lines, arranged parallel to said word line, containing a first common source line; and
a plurality of sub-memory arrays, each is connected to a group of said bit lines, two said word lines, and a said common source line, each of said sub-memory arrays includes:
a first memory cell, connected to said first group bit lines, said first common source line, and said first word line, and
a second memory cell, connected to said first group bit lines, said first common source line, and said second word line, said first memory cell and said second memory cell are arranged opposite to each other, and are located on two different sides of the first common source line;
wherein said first group bit line includes said bit line, connected to said first and second memory cells and when said first and said second memory cells both contain a P-type field effect transistor located in an N-type well region or an N-type substrate, said first and second memory cells are both said operation memory cells, in selecting one of said operation memory cells as said selected memory cell in carrying out operations, said operation memory cells, that are connected to said same bit line connecting to said selected memory cell, but not connected to said same common source line connecting to said selected memory cell, are referred to as said plurality of common bit memory cells; said operation memory cell, that is connected to said same bit line and said same common source line, both connecting to said selected memory cell, is referred to as said common source memory cell; and said operation memory cells, that are connected to said same word line connecting to said selected memory cell, are referred to as said plurality of common word memory cells; and rest of said operation memory cells are referred to said plurality of unselected memory cells, when operating on said selected memory cells, performing the following voltage applications as required:

applying said substrate voltage $V_{subn}$ on said N-type well region or said N-type substrate connecting to said selected memory cell; applying said first bit voltage $V_{b1}$, said first word voltage $V_{w1}$, said first common source voltage $V_{s1}$ on said bit line, said word line, and said common source line, all connecting to said selected memory cell; applying said second word voltage $V_{w2}$, said second common source voltage $V_{s2}$ respectively on said word line and said common source line, both connecting to each said common bit memory cell; applying said second bit voltage $V_{b2}$, said first common source voltage $V_{s1}$ on said bit line and said common source line, both connecting to each said common word memory cell; applying said second word voltage $V_{w2}$ on said word line connecting to said common source memory cell; and applying said second bit voltage $V_{b2}$, said second word voltage $V_{w2}$, and said second common source voltage $V_{s2}$ on said bit line, said word line, and said common source line, all connecting to each said unselected memory cell, such that, when writing data into a memory, the following conditions are to be satisfied:

$V_{b2}$ is floating, $V_{subn}>V_{s1}>V_{b1}$, $V_{subn}>V_{s1}>V_{w1}$, $V_{subn}>V_{s2}>V_{b1}$, and $V_{subn}>V_{w2}>V_{b1}$; and when erasing data from the memory, the following conditions are to be satisfied:

$V_{b2}$ is floating, $V_{subn}=V_{s1}\geq V_{w1}>V_{b1}$, $V_{subn}>V_{s2}>V_{b1}$, and $V_{subn}>V_{w2}>V_{b1}$.

15. A cost saving electrically-erasable-programmable read-only memory (EEPROM) array, comprising:
a plurality of parallel bit lines, that are classified into a plurality groups of bit lines, containing a first group bit lines;
a plurality of parallel word lines, arranged perpendicular to said bit lines, and containing a first word line and a second word line;
a plurality of parallel common source lines, arranged parallel to said word line, containing a first common source line; and
a plurality of sub-memory arrays, each is connected to a group of said bit lines, two said word lines, and a said common source line, each of said sub-memory arrays includes:
a first memory cell, connected to said first group bit lines, said first common source line, and said first word line, and
a second memory cell, connected to said first group bit lines, said first common source line, and said second word line, said first memory cell and said second memory cell are arranged opposite to each other, and are located on two different sides of the first common source line;
wherein said first memory cell further comprises:
said field effect transistor, having a floating gate, and with its drain connected to said first group bit lines, and with its source connected to said first common source line; and
a capacitor, with its one end connected to said floating gate, and with its other end connected to said first word line, so as to receive voltage of said first word line, said field effect transistor receives voltage of said first common source line, and voltage of said first group bit lines, such that said field effect transistor writes data into said floating gate, or erases data from said floating gate.

16. A cost saving electrically-erasable-programmable read-only memory (EEPROM) array, comprising:
a plurality of parallel bit lines, that are classified into a plurality groups of bit lines, containing a first group bit lines;
a plurality of parallel word lines, arranged perpendicular to said bit lines, and containing a first word line and a second word line;
a plurality of parallel common source lines, arranged parallel to said word line, containing a first common source line; and
a plurality of sub-memory arrays, each is connected to a group of said bit lines, two said word lines, and a said common source line, each of said sub-memory arrays includes:
a first memory cell, connected to said first group bit lines, said first common source line, and said first word line, and
a second memory cell, connected to said first group bit lines, said first common source line, and said second word line, said first memory cell and said second memory cell are arranged opposite to each other, and are located on two different sides of the first common source line;
wherein said second memory cell further comprises:
said field effect transistor, having a floating gate, and with its drain connected to said first group bit lines, and with its source connected to said first common source line; and
a capacitor, with its one end connected to said floating gate, and with its other end connected to said second word line, so as to receive voltage of said second word line, said field effect transistor receives voltage of said first common source line, and voltage of said first group bit lines, such that said field effect transistor writes data into said floating gate, or erases data from said floating gate.

* * * * *